US005202306A

United States Patent [19]

[11] Patent Number: 5,202,306

[45] Date of Patent: Apr. 13, 1993

Goretta et al.

[54] FRACTURE TOUGHNESS FOR COPPER OXIDE SUPERCONDUCTORS

[75] Inventors: Kenneth C. Goretta, Downers Grove, Ill.; Marc L. Kullberg, Lisle, both of Ill.

[73] Assignee: The United States of America as represented by the United States Department of Energy, Washington, D.C.

[21] Appl. No.: 761,551

[22] Filed: Sep. 18, 1991

[51] Int. Cl.[5] .................... H01B 12/06; H01L 39/12; H01L 39/02

[52] U.S. Cl. .................................... 505/1; 505/785; 505/780; 505/782; 505/783; 252/518; 252/521; 501/103; 501/104; 501/123; 501/126; 501/152

[58] Field of Search .................... 428/930; 505/1, 785, 505/780, 782, 783; 501/103, 104, 123, 126, 152; 252/518, 521; 427/214, 213, 213.31, 372.2, 376.2

[56] References Cited

U.S. PATENT DOCUMENTS 4,985,379 1/1991 Egerton et al. ................ 427/376.2

FOREIGN PATENT DOCUMENTS 9004856 5/1990 World Int. Prop. O. .

OTHER PUBLICATIONS

Sakai et al., "Superconductivity of $YBa_2Cu_3O_{7-x}$ by Addition of Reactive Fine Powders" *Jap. Jour. Appl. Phy.*, vol. 30, No. 2, Feb. 1991, pp. 246-250.

Cheung et al., "Superconductor-Substrate Interactions of Y-$B_a$-Cu Oxide" *J. Mat. Res.*, vol. 4, No. 1, Jan.-/Feb. 1989, pp. 1-15.

*Primary Examiner*—Mark L. Bell
*Assistant Examiner*—C. M. Bonner
*Attorney, Agent, or Firm*—James W. Weinberger; John M. Albrecht; William R. Moser

[57] ABSTRACT

An oxide-based strengthening and toughening agent, such as tetragonal $Zro_2$ particles, has been added to copper oxide superconductors, such as superconducting $YBa_2Cu_3O_x$ (123) to improve its fracture toughness ($K_{IC}$). A sol-gel coating which is non-reactive with the superconductor, such as $Y_2BaCuO_5$ (211) on the $ZrO_2$ particles minimized the deleterious reactions between the superconductor and the toughening agent dispersed therethrough. Addition of 20 mole percent $ZrO_2$ coated with 211 yielded a 123 composite with a $K_{IC}$ of 4.5 $MPa(m)^{0.5}$.

23 Claims, 3 Drawing Sheets

FRACTURE TOUGHNESS FOR COPPER OXIDE SUPERCONDUCTORS

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

Bulk ceramic copper oxide superconductors can experience large stresses in many applications. A useful design criterion for the mechanical properties of this type of superconductor is the ability to withstand a strain of 0.2%. The high-temperature superconductor $YBa_2Cu_3O_x$ (123) is generally weak because of its low fracture toughness and the presence of relatively large flaws and thus, in general, does not have the desired flexibility. The fracture toughness ($K_{IC}$) of 123 is generally only $=1$-$2$ Mpa(m)$e^{0.5}$. Fracture toughness is related to fracture strength ($\sigma_f$) by $$K_{IC}=Y\,\sigma_f(\pi c)^{0.5},$$

where Y is a geometric factor and c is the size of the critical flaw. Therefore, if the flaw population remains constant, increases in $K_{IC}$ should impart proportional increases in strength. The flexibility of a brittle wire or tape is directly related to its strength by $$\sigma_f=(r/p)E.$$

where r is the radius of the wire, p is the bending radius, and E is the Young's modulus. Thus, even in the absence of ductility, significant increases in $K_{IC}$ may help allow for fabrication of robust, flexible wires and tapes. This invention is applicable generally to the ceramic copper oxide superconductors, including the 123 superconductor and the superconductors having various rare earth substitutions for yttrium. In addition, the invention pertains to other presently known ceramic copper oxide superconductors, namely Bi-Sr-Ca-Cu-$O_x$ (several different phases are known) and Tl-Ba-Ca-Cu-$O_x$ (several different phases are known). When we speak of copper oxide superconductors we mean these three systems.

$K_{IC}$ of ceramics can be enhanced by several means. Some mechanisms, such as promotion of a tortuous crack path, lead to only modest improvements. Others, such as microcrack toughening, can be effective, but would be of little use to 123 superconductor or the other ceramic copper oxide superconductors owing to a concomitant degradation of electrical properties. The mechanisms that show the most promise for toughening high-temperature superconductors involve addition of second-phase particles. It has been shown that addition of 15 to 20 volume percent Ag particles nearly doubles $K_{IC}$ and can improve strength. The improvements are due to the ductility of the Ag and to a favorable residual stress state in which the brittle ceramic is in compression and the ductile Ag is in tension.

It has been found that dispensing an agent throughout a ceramic copper oxide superconductor, if the agent is properly chosen and coated, improves the toughness and strength of the superconductor without degrading the superconducting properties. The dispersed agents are $ZrO_2$, $Al_2O_3$, MgO, $Al_2O_3.SiO_2$ (mullite) and $SiO_2$. The preferred agents are $ZrO_2$, $Al_2O_3$ and MgO. The agents commercially are available in various physical forms, such as particles, whiskers, platelets and continuous fibers. When $ZrO_2$ particles are used, the tetragonal $ZrO_2$ must be employed, whereas $ZrO_2$ whiskers and continuous fibers need not be tetragonal. $Al_2O_3$ is available in whiskers, fibers and platelets and any such form or forms is acceptable. MgO is available in whiskers and continuous fibers, either of which is satisfactory as well as mixtures of both forms. $Al_2O_3.SiO_2$ is available in continuous fibers, whiskers and platelets, while $SiO_2$ is available in continuous fibers and whiskers.

Generally, it has been found that the agent should be present in a concentration of at least about 10 mole percent of the superconductor and not more than about 30 mole percent. The preferred concentration is about 20 mole percent. Various compounds may be used to protect the agent and prevent deleterious chemical reaction with the superconductor. The coating compounds are selected from the phase diagram for each of the superconductor systems. The selected compounds have the properties of being entirely chemically compatible with the respective superconductor. No chemical potential exists between the superconductor and the compound and there is no thermodynamic driving force for interdiffusion. In addition, the compounds listed have been found to be less reactive with foreign oxide additives (e.g., $ZrO_2$ or MgO) than would be the superconductor itself. The coating compounds are $Y_2BaCuO_5$ (otherwise known as 211), $Ca_2CuO_3$, $Sr_2CuO_3$, $(Ca,Sr)_1CuO_2$ and $CaCuO_2$. Specifically, the 211 compound is used to protect agents dispersed in the $YBa_2Cu_3O_x$ superconductor. $Ca_2CuO_3$ or $Sr_2CuO_3$ or $(Ca,Sr)_1CuO_2$ or mixtures thereof are used to protect agents dispersed in Bi-Sr-Ca-Cu-$O_x$ ceramic copper oxide superconductors, while $Ca_2CuO_3$ or $CaCuO_2$ or $(Ca,Sr)_1CuO_2$ mixtures thereof are used to protect agents dispersed in Tl-Ba-Ca-Cu-$O_x$ ceramic oxide superconductors.

SUMMARY OF THE INVENTION

This invention is based on the finding that tetragonal $ZrO_2$ particles can be coated with $Y_2BaCuO_5$ (211) and that these coated particles increase the $K_{IC}$ of 123 when dispersed in the superconductor and prevent the $ZrO_2$ from chemically reacting with the 123 material. These experiments in which $\approx 10$ mole percent 211-coated $ZrO_2$ was added to 123 produced an increase in $K_{IC}$ from $1.5\pm0.5$MPa$(m)^{0.5}$t to $2.6\pm0.4$MPa$(m)^{0.5}$.

However, the 123 superconductor and $ZrO_2$ will chemically react: as a consequence, 123 decomposes into 211, CuO, and $BaCuO_2$, and ultimately $BaZrO_3$ is formed. This reaction is undesirable because the amount of superconducting material is decreased and because intact $ZrO_2$ is needed for the improvement in $K_{IC}$ of the host 123. The 211 phase is more refractory than is 123 and is chemically compatible with 123. The 211 phase acts as an effective barrier layer that limits deleterious interaction between the 123 and $ZrO_2$. The invention, generally, is providing an agent for addition to a copper oxide superconductor which strengthens and toughens the superconductor and coating the agent with a component which is chemically inert to the superconductor to prevent degradation of the superconductor when the agent is added thereto.

Accordingly, it is an object of the invention to provide a material which can be added to a ceramic copper oxide superconductor that is chemically inert thereto and which strengthens and toughens the superconductor.

Another object of the invention is to provide stronger and tougher ceramic oxide superconductors and methods of making same.

Yet another object of the invention is to provide a ceramic copper oxide superconductor having dispersed therethrough an oxide-based strengthening and toughening agent selected from the class consisting of $ZrO_2$, $Al_2O_3$, MgO, $Al_2O_3$-$SiO_2$, $SiO_2$ and mixtures thereof present in a amount in the range of from about 10 mole percent to about 30 mole percent, the agent being present as a discrete phase coated with a compound chemically inert to the superconductor, the compound being selected from the class consisting of $Y_2BaCuO_5$, $Ca_2CuO_3$, $Sr_2CuO_3$, (Ca, Sr)$_1CuO_2$ and $CaCuO_2$.

Still another object of the invention is to provide a ceramic copper oxide superconductor selected from the class consisting of $YBa_2Cu_3O_x$, Bi-Sr-Ca-Cu-$O_2$ and Tl-Ba-Ca-Cu-$O_x$ having dispersed therethrough an oxide-based strengthening and toughening agent selected from the class consisting of $ZrO_2$, $Al_2O_3$, MgO and mixtures thereof present in the range of from about 10 mole percent to about 30 mole percent, the agent being present as a discrete phase coated with a compound chemically inert to the superconductor, the compound being selected from the class consisting of $Y_2BaCuO_5$, $Ca_2CuO_3$, $Sr_2CuO_3$, (Ca, Sr)1CuCO$_2$ and $CaCuO_2$.

A final object of the invention is to provide a method of toughening a ceramic copper oxide superconductor comprising forming a solution of the salts of a chemical compound selected from the group consisting of $Y_2BaCuO_5$, $Ca_2CuO_3$, $Sr_2CuO_3$ (Ca, Sr)$_1CuO_2$ and $CaCuO_2$ in a solvent wherein the salts are present in ratios to produce one of the group, introducing particulates of an agent in particle, whisker, platelet or continuous fiber form into the solution, the agent being selected from the class consisting of $ZrO_2$ whiskers or continuous fibers, tetragonal $ZrO_2$ particles, $Al_2O_3$, MgO, $Al_2O_3$-$SiO_2$, $SiO_2$ and mixtures thereof, adjusting the pH of the solution until the agent or agents are uniformly dispersed in the solution forming a sol, spray drying the sol and calcining to form the agent particulates coated with one of the group of compounds, thereafter mixing the coated agent particulates with a powder of a ceramic copper oxide superconductor wherein the coated agent particulates are present in the range of from about lo mole percent to about 30 mole percent, and thereafter forming the mixture into a solid ceramic copper oxide superconductor having a theoretical density of not less than about 85%.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DETAILED DESCRIPTION OF THE INVENTION

Phase-pure, orthorhombic 123 was synthesized by solid-state reaction of reagent-grade $Y_2O_3$, $BaCO_3$, and CuO powders. Synthesis was accomplished in 4 hours at 800° C by exposure to pure $O_2$ of reduced total pressure. Part of the 123 powder was mixed by mortar and pestle with $\approx$10 or 20 mole percent tetragonal $ZrO_2$ particles (composition 97 mole percent $ZrO_2$, 3 mole percent $Y_2O_3$; average particle size $\approx$0.8 $\mu$m) that had been coated with 211. The remaining pure 123 and the 123 with 211-$ZrO_2$ additions were used to make bars for testing. The 211 solution for coating the $ZrO_2$ was prepared from metal acetate salts dissolved in distilled water. The aqueous solution was heated to assist in dissolving the solids and ammonium hydroxide was added to adjust the pH and stabilize the solution. If base was not used, the acetate salts precipitated and homogeneity was lost.

Figure 1:
FIG. 1 is a SEM micrograph of spray-dried coatings on $ZrO_2$ particles.

The as-received $ZrO_2$ powder contained agglomerates that were 10 to 50 $\mu$m in diameter. The $ZrO_2$ powder was ball milled and dried to break up the agglomerates prior to use. Spray drying of the slurry of $ZrO_2$ and 211precursor solution produced a fine-particle-size powder. Little reagglomeration of the coated particles occurred during spray drying (FIG. 1).

Figure 2:
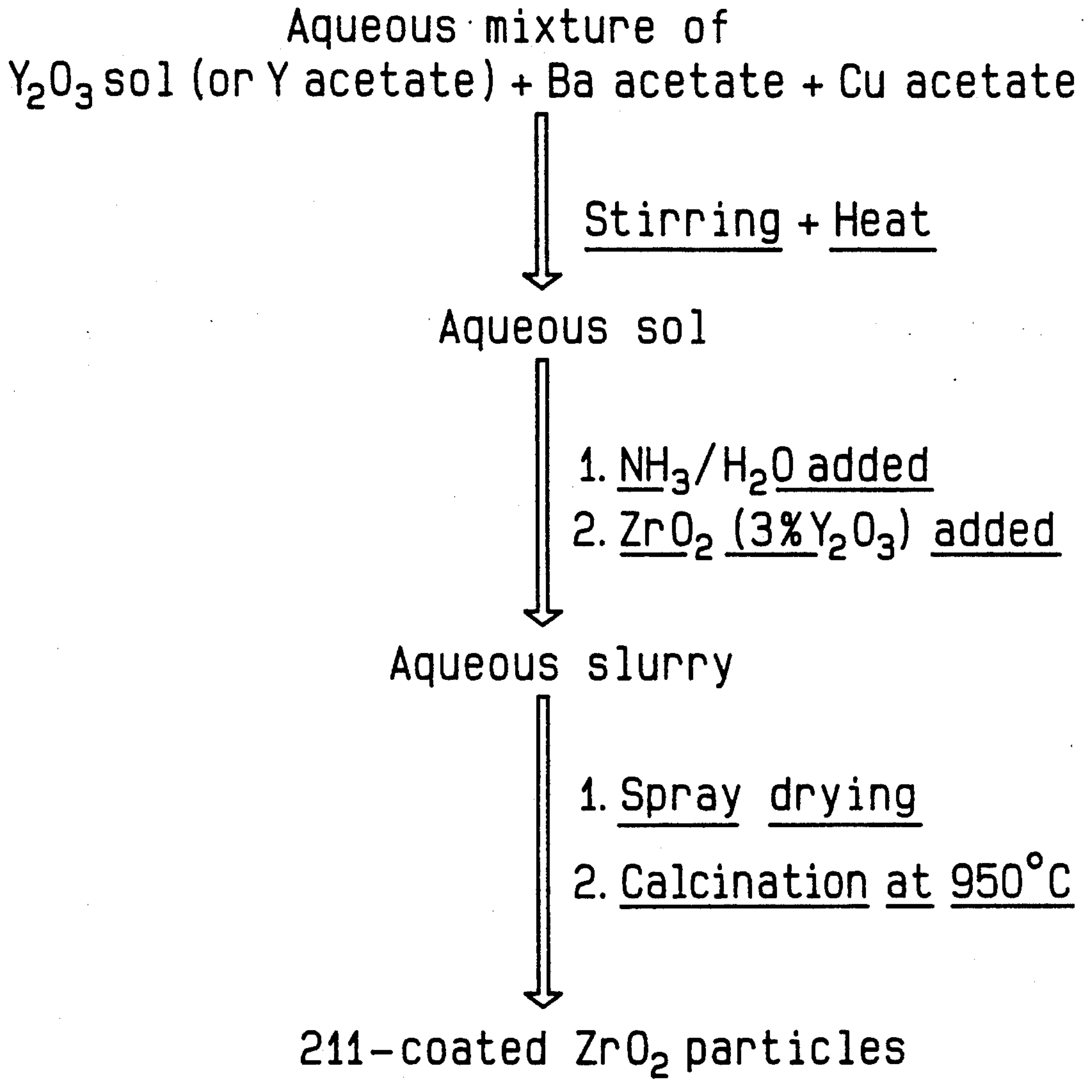
FIG. 2 is a flow chart of process for making 211 coatings on tetragonal $ZrO_2$ particles.

The coated $ZrO_2$ powder was calcined in air at 950° C. for 4 hours, which converted the precursor metal salts to 211. FIG. 2 shows a flow chart of the process from sol to a 211-coated $ZrO_2$ powder. X-ray diffraction analysis indicated that $ZrO_2$ and 211 were present and that some $BaZrO_3$ was also produced. The $BaZrO_3$ was probably at the 211/$ZrO_2$ interface, and thus was separated from the 123. Irrespective of its proximity to the 123, $BaZrO_3$ is much less reactive with 123 than is $ZrO_2$.

Bar specimens were cold pressed from the 123 and 123/211/$ZrO_2$ powders. The average bar dimensions before firing were about 50 mm×7 mm×3 mm. The bars were sintered for 3–6 hours in flowing $O_2$ at temperatures from 950° to 990° C. The densities of the bars were calculated from the masses and measured dimensions. Some of the bars that were sintered at 990° C. were annealed in Oz at 425°–450° C. for 10 hours to convert the tetragonal 123 to the superconducting orthorhombic phase. Resistivity versus temperature curves were obtained for these bars. In addition, critical current densities were obtained at 77K with zero applied magnetic field. A standard 4-probe method and a criterion of 1 $\mu$V/cm were used.

Fracture toughness values were determined for the remaining bars by the single-edge notched beam method. Notches were cut normal to a 3 mm×50 mm face (into the 7-mm dimension) and were about 3 mm deep. Four bars of each composition were loaded separately in three-point bending at a rate of 1.27 mm/min. $K_{IC}$ was calculated from $K_{IC}=3\,P\,L\,Y\,(C)^{0.5}/B\,W^2$.

where P is the load, L is the support span (19 mm for these tests), Y is a constant related to the specimen geometry, C is the notch depth, B is the specimen width ($\approx$3 mm), and W is the specimen height ($\approx$7 mm). Some of the bars were also tested in the unnotched condition in 3-point bending to determine strength. The fracture surfaces of several bars were examined by scanning electron microscopy (SEM).

In addition to the acetate salts dissolved in water used in the method disclosed above, other suitable solvents include ethanol, methoxy ethanol and ethylene glycol (when nitrate salts are used). Salts other than acetates are acceptable, such as hydroxides or nitrates. The alkoxides such as isopropoxide of the ceramic superconductors may be used for preparing same and also used for the salts of the agents.

It was found that additions of 10 mole percent tetragonal $ZrO_2$ to 123 improved $K_{IC}$ only if the 123 superconductor material was at least 80% dense. For bars fired at 930°-950° C., the densities were 85-90% of theoretical and $K_{IC}$ increased from 1.2-1.5 MPa(m)$^{0.5}$ for pure 123 to $\approx$2.5 MPa(m)$^{0.5}$ for the 123+10% $ZrO_2$.

The 211 coatings allow for high sintering temperatures without excessive reaction between 123 and $ZrO_2$. Sintering in $O_2$ at 900° C. produced 123/211$ZrO_2$ composites that were 85-90% dense and 123 bars that were $\approx$93% dense. A summary of the $K_{IC}$ data is shown in Table 1.

TABLE 1

$K_{IC}$ data for 123 and 123/211/$ZrO_2$ bars for various heat treatments in $O_2$; the error bars are standard deviations.

| Composition | Sintering T (°C.)/ time (h) | Density (% theo- retical) | $K_{IC}$ (MPa(m)$^{0.5}$) |
|---|---|---|---|
| 123 | $\approx$930/6 | $\approx$85 | 1.2 ± 0.1 |
| 123 | $\approx$950/6 | $\approx$90 | 1.5 ± 0.3 |
| 123 | $\approx$990/6 | $\approx$93 | 3.1 ± 0.4 |
| 123/211/10% $ZrO_2$ | $\approx$990/6 | 85-90 | 3.6 ± 0.4 |
| 123/211/20% $ZrO_2$ | $\approx$990/6 | 85-90 | 4.5 ± 0.3 |

Figure 3A:
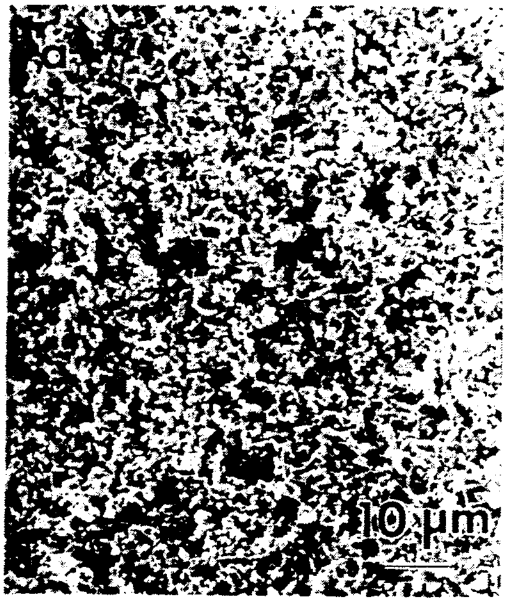
FIGS. 3(*a*)-(*c*) are SEM photographs of fracture surfaces: (a) 123 bar that was sintered in $O_2$ at 930° C. for 6 hours and was $\approx$80% dense, (b) 123 bar that was sintered in $O_2$ at 990° for 6 hours, and (c) 123/211/20 mole percent $ZrO_2$ bar that was sintered in $O_2$ at 990° C. for 6 hours.
Figure 3B:
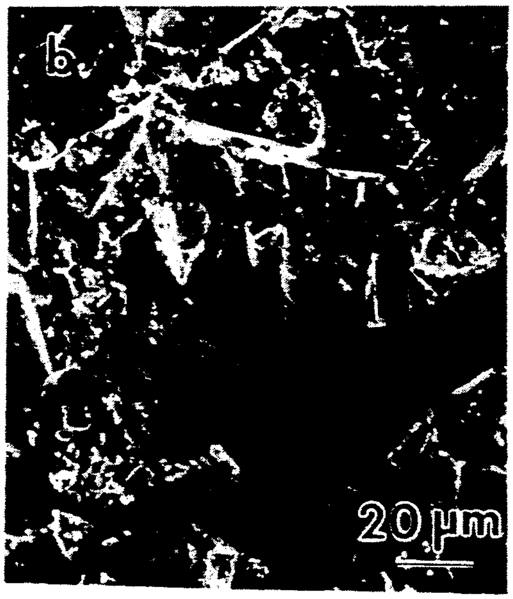
Figure 3C:
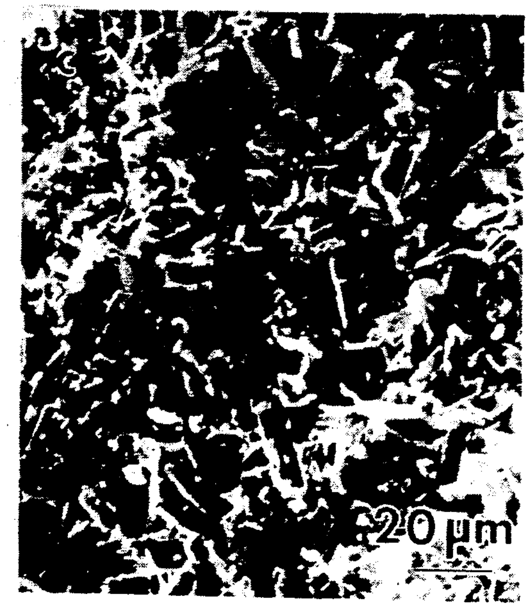

The first observation is that higher temperatures produced denser tougher 123 superconductor. SEM revealed that significant grain growth accompanied the additional densification, see FIGS. 3(*a*)-(*b*). The $K_{IC}$ tests produced primarily intergranular fracture paths. For such fracture, it is known for ceramics that $K_{IC}$ increases with grain size because the crack path becomes more tortuous.

$ZrO_2$ additions improved $K_{IC}$, but only modest improvement was observed for $\approx$10 mole percent additions. 20 mole percent $ZrO_2$ improved the $K_{IC}$ by nearly 50% (Table 1). It should be noted that for specimens of constant density, the 10 mole percent $ZrO_2$ additions also increased $K_{IC}$ by $\approx$50%.

The average strengths of the 123 ceramic oxide superconductor and 123/211 $ZrO_2$ bars were all about 60 MPa, despite the differences in $K_{IC}$. The composite bars possessed a finer grain size (FIGS. 3*a*-*c*), which should, if anything, lead to increased strength because of a reduced flaw size. Examination of the fracture surfaces revealed, however, that regions surrounding some of the 211-coated $ZrO_2$ particles were poorly sintered. These porous regions were larger than the grain size and constituted large flaws. It is assumed that failure initiated in these regions. Thus, an increased $K_{IC}$ was compensated for by an increased flaw size, with a net result of no change in strength.

All of the 123 ceramic superconductors and 123/211/$ZrO_2$ bars that were measured exhibited a $T_c$ onset of $\approx$90K. At 77K in zero applied field, the $J_c$ values of the bars were $\approx$200-300 A/cm$^2$. No significant differences in $J_c$ were observed among the specimens. The average $J_c$ values were quite low and were in part attributable to the large grain sizes of the specimens. It is believed that stresses generated during cooling induce microcracking, which leads to lower $J_c$ values. The magnitude of these stresses is proportional to grain size.

A $J_c$ of 200 A/cm$_2$ is not sufficient for most applications, but may be adequate for some that require only modest current densities. For those applications, mechanical reliability is likely to be important.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A ceramic copper oxide superconductor having dispersed therethrough an oxide-based strengthening and toughening agent selected from the class consisting of $ZrO_2$, $Al_2O_3$, MgO, $Al_2O_3.SiO_2$, $SiO_2$ and mixtures thereof present in a amount in the range of from about 10 mole percent to about 30 mole percent, said agent being present as a discrete phase coated with a compound chemically inert to the superconductor, said compound being selected from the class consisting of $Y_2BaCuO_5$, $Ca_2CuO_3$, $Sr_2CuO_3$, $(Ca, Sr)_1CuO_2$ and $CaCuO_2$.

2. The ceramic copper oxide superconductor of claim 1, wherein the agent is present in the range of from about 10 mole percent to about 25 mole percent.

3. The ceramic copper oxide superconductor of claim 1, wherein the agent is present in an amount of about 20 mole percent.

4. The ceramic copper oxide superconductor of claim 1, wherein the superconductor is $YBa_2Cu_3O_x$ and the compound coating the agent is $Y_2BaCuO_5$.

5. The ceramic copper oxide superconductor of claim 1, wherein the superconductor is Bi-Sr-Ca-Cu-$O_x$ and the compound coating the agent is selected from $Ca_2CuO_3$, $Sr_2CuO_3$, $(Ca, Sr)_1CuO_2$ or mixtures thereof.

6. The ceramic copper oxide superconductor of claim 1, wherein the superconductor is Tl-Ba-Ca-Cu-$O_x$ and the compound coating the agent is selected from $Ca_2CuO_3$, $CaCuO_2$ $(Ca,Sr)_1CuO_2$ and mixtures thereof.

7. The ceramic copper oxide superconductor of claim 1, wherein the agent is $ZrO_2$ present in the form of whiskers, continuous fibers or tetragonal $ZrO_2$ particles.

8. The ceramic copper oxide superconductor of claim 1, wherein the agent is $Al_2O_3$ in the form of whiskers, continuous fibers or platelets.

9. The ceramic copper oxide superconductor of claim 1, wherein the agent is MgO in the form of whiskers or continuous fibers.

10. The ceramic copper oxide superconductor of claim 1, wherein the agent is $Al_2O_3.SiO_2$ in the form of whiskers, continuous fibers or platelets.

11. The ceramic copper oxide superconductor of claim 1, wherein the agent is $SiO_2$ in the form of fibers or whiskers.

12. The ceramic copper oxide superconductor of claim 1, wherein the density is between about 85 to about 95% of theoretical.

13. A ceramic copper oxide superconductor selected from the class consisting of $YBa_2Cu_3O_x$, Bi-Sr-Ca-Cu-$O_x$ and Tl-Ba-Ca-Cu-$O_x$ having dispersed therethrough an oxide-based strengthening and toughening agent selected from the class consisting of $ZrO_2$, $Al_2O_3$, MgO and mixtures thereof present in the range of from about 10 mole percent to about 30 mole percent, said agent being present as a discrete phase coated with a compound chemically inert to the superconductor, said compound being selected from the class consisting of $Y_2BaCuO_5$, $Ca_2CuO_3$, $Sr_2CuO_3$, (Ca, $Sr)_1CuCO_2$ and $CaCuO_2$.

14. The ceramic oxide superconductor of claim 13 wherein the agent is present in the range of from about 15 mole percent to about 25 mole percent.

15. The ceramic oxide superconductor of claim 14, wherein the superconductor is $YBa_2Cu_3O_x$ and the compound is $Y_2BaCuO_5$.

16. The ceramic oxide superconductor of claim 15, wherein the agent is $ZrO_2$.

17. The ceramic oxide superconductor of claim 16, wherein the agent is tetragonal $ZrO_2$ particles present in amount of about 20 mole percent.

18. The ceramic oxide superconductor of claim 14, wherein the superconductor is Bi-Sr-Ca-Cu-$O_x$ and the compounds are one or more of $Ca_2CuO_3$, $Sr_2CuO_3$ and (Ca, $Sr)_1CuO_2$.

19. The ceramic oxide superconductor of claim 14, wherein the superconductor is Tl-Ba-Ca-Cu-$O_x$ and the compounds are one or more of $Ca_2CuO_3$, (Ca, $Sr)_1$,$CuO_2$ and $CaCuO_2$.

20. A method of toughening a ceramic copper oxide superconductor comprising forming a solution of the salts of a chemical compound selected from the group consisting of $Y_2BaCuO_5$, $Ca_2CuO_3$, $Sr_2CuO_3$ (Ca, $Sr)_1CuO_2$ and $CaCuO_2$ in a solvent wherein the salts are present in ratios to produce one of said group, introducing particulates of an agent in particle, whisker, platelet or continuous fiber form into the solution, said agent being selected from the class consisting of $ZrO_2$ whiskers or continuous fibers, tetragonal $ZrO_2$ particles, $Al_2O_3$, MgO, $Al_2O_3.SiO_2$, $SiO_2$ and mixtures thereof, adjusting the pH of the solution until the agent or agents are uniformly dispersed in the solution forming a sol, spray drying the sol and calcining to form the agent particulates coated with one or more of said compounds, thereafter mixing the coated agent particulates with a powder of a ceramic copper oxide superconductor wherein the coated agent particulates are present in the range of from about 10 mole percent to about 30 mole percent, and thereafter forming the mixture into a solid ceramic copper oxide superconductor having a theoretical density of not less than about 85%.

21. The method of claim 20, wherein the ceramic oxide superconductor is one of $YBa_2Cu_3O_x$, Bi-Sr-Ca-Cu $O_x$ and Tl-Ba-Ca-Cu-$O_x$.

22. The method of claim 21, wherein the solution is formed with a solvent selected from one or more of water, ethanol, methoxy ethanol or ethylene glycol and the salts are acetates, hydroxides or nitrates.

23. The method of claim 20, wherein the ceramic oxide superconductor is $YBa_2Cu_3O_x$, the solvent is water and the salts are acetates.

* * * * *